(12) United States Patent
Min

(10) Patent No.: US 10,483,373 B2
(45) Date of Patent: Nov. 19, 2019

(54) SEMICONDUCTOR DEVICE

(71) Applicant: SAMSUNG ELECTRONICS CO., LTD., Suwon-si, Gyeonggi-do (KR)

(72) Inventor: Sun-Ki Min, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/039,371

(22) Filed: Jul. 19, 2018

(65) Prior Publication Data

US 2019/0051730 A1 Feb. 14, 2019

(30) Foreign Application Priority Data

Aug. 11, 2017 (KR) .................. 10-2017-0102415

(51) Int. Cl.
| | |
|---|---|
| *H01L 29/76* | (2006.01) |
| *H01L 29/66* | (2006.01) |
| *H01L 23/532* | (2006.01) |
| *H01L 21/762* | (2006.01) |
| *H01L 29/423* | (2006.01) |
| *H01L 21/033* | (2006.01) |
| *H01L 29/06* | (2006.01) |
| *H01L 21/28* | (2006.01) |
| *H01L 29/78* | (2006.01) |
| *H01L 29/49* | (2006.01) |
| *H01L 29/51* | (2006.01) |

(52) U.S. Cl.
CPC ...... *H01L 29/6656* (2013.01); *H01L 21/0334* (2013.01); *H01L 21/28114* (2013.01); *H01L 21/762* (2013.01); *H01L 23/53295* (2013.01); *H01L 29/0649* (2013.01); *H01L 29/4232* (2013.01); *H01L 29/42376* (2013.01); *H01L 29/6653* (2013.01); *H01L 29/66545* (2013.01); *H01L 29/785* (2013.01); *H01L 29/4966* (2013.01); *H01L 29/517* (2013.01)

(58) Field of Classification Search
CPC ............ H01L 29/6656; H01L 29/0649; H01L 29/4232; H01L 29/66545; H01L 21/0334; H01L 21/762; H01L 23/53295
USPC ........................................................ 257/288
See application file for complete search history.

(56) References Cited

U.S. PATENT DOCUMENTS

| | | |
|---|---|---|
| 7,517,746 B2 | 4/2009 | Lin et al. |
| 8,329,546 B2 | 12/2012 | Lee et al. |
| 8,530,317 B1 | 9/2013 | Wu et al. |
| 8,592,265 B2 | 11/2013 | Kim et al. |
| 9,136,181 B2 | 9/2015 | Xu et al. |
| 9,397,189 B2 | 7/2016 | Chen et al. |
| 9,425,048 B2 | 8/2016 | Lin et al. |

(Continued)

*Primary Examiner* — Tu-Tu V Ho
(74) *Attorney, Agent, or Firm* — Lee & Morse, P.C.

(57) ABSTRACT

A semiconductor device including a first insulating interlayer on a substrate; a second insulating interlayer on the first insulating interlayer; a gate structure extending through the first insulating interlayer and the second insulating interlayer on the substrate, a lower portion of the gate structure having a first width, and an upper portion of the gate structure having a second width that is greater than the first width and that gradually increases from a bottom toward a top thereof; and a spacer structure on a sidewall of the gate structure, a width of an upper portion of the spacer structure being less than a width of a lower portion of the spacer structure.

20 Claims, 17 Drawing Sheets

(56) References Cited

U.S. PATENT DOCUMENTS

2016/0049488 A1* 2/2016 Shen ................. H01L 29/42376
                                                                      257/368
2017/0141107 A1* 5/2017 Kim .................... H01L 23/5283

\* cited by examiner

FIG. 4
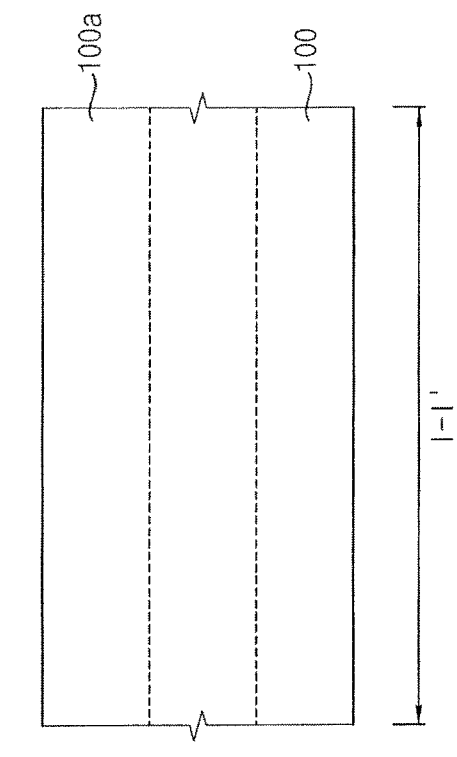
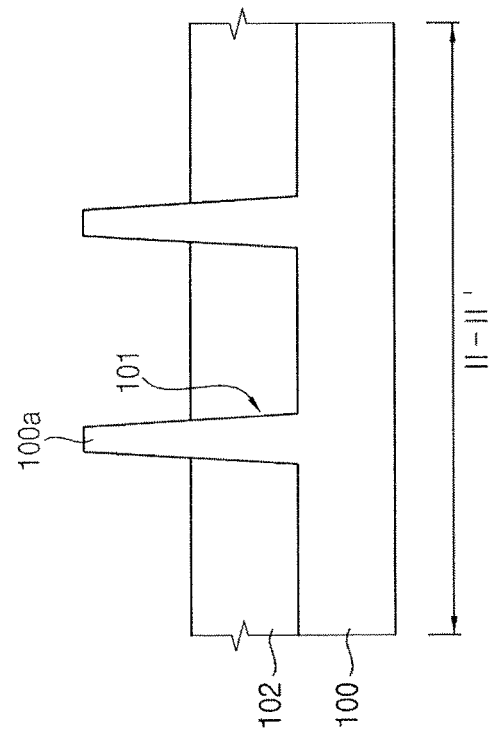

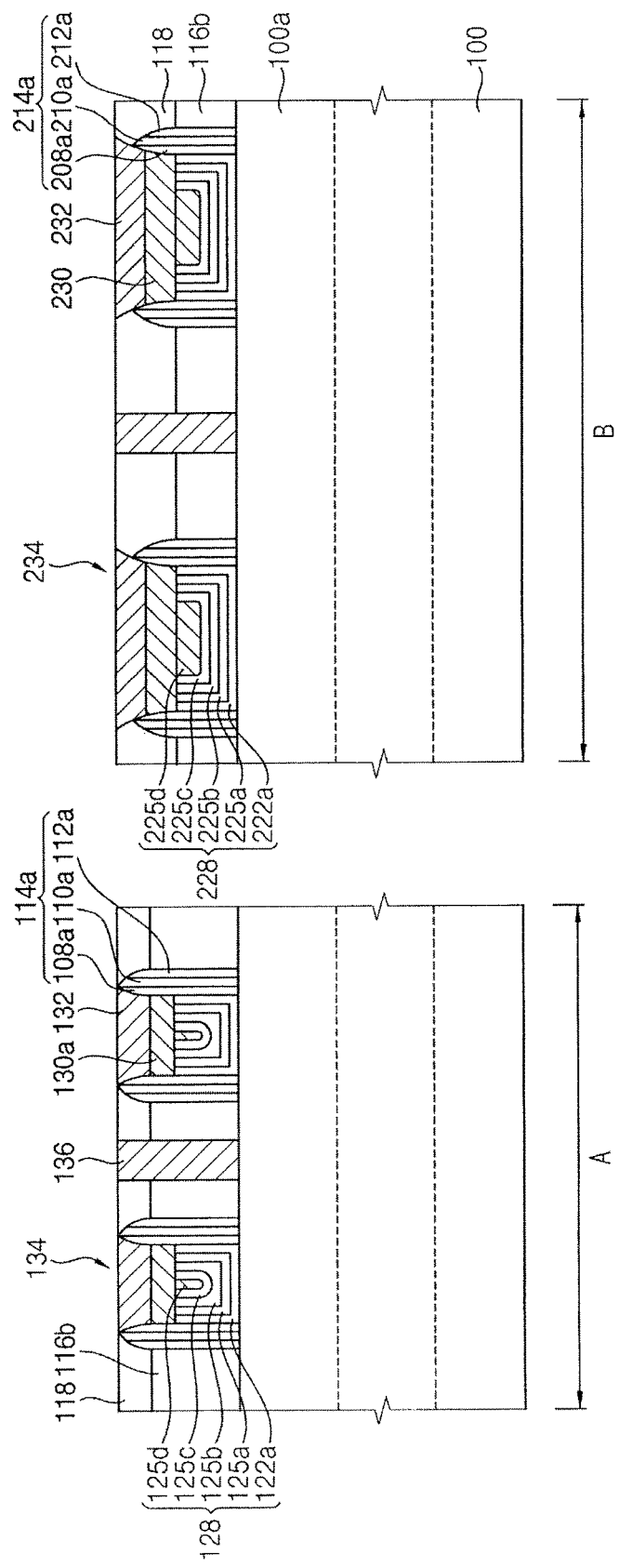

SEMICONDUCTOR DEVICE

CROSS-REFERENCE TO RELATED APPLICATION

Korean Patent Application No. 10-2017-0102415, filed on Aug. 11, 2017, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Recently, a highly integrated semiconductor device including a transistor has been considered. The transistor may include a metal gate structure.

SUMMARY

The embodiments may be realized by providing a semiconductor device including a first insulating interlayer on a substrate; a second insulating interlayer on the first insulating interlayer; a gate structure extending through the first insulating interlayer and the second insulating interlayer on the substrate, a lower portion of the gate structure having a first width, and an upper portion of the gate structure having a second width that is greater than the first width and that gradually increases from a bottom toward a top thereof; and a spacer structure on a sidewall of the gate structure, a width of an upper portion of the spacer structure being less than a width of a lower portion of the spacer structure.

The embodiments may be realized by providing a semiconductor device including a first insulating interlayer on a substrate, the substrate including first and second regions; a second insulating interlayer on the first insulating interlayer; first gate structures extending through the first insulating interlayer and the second insulating interlayer on the first region of the substrate, a lower portion of each of the first gate structures having a first width, and an upper portion of each of the first gate structures having a second width that is greater than the first width and that gradually increases from a bottom toward a top thereof; a first spacer structure on a sidewall of each of the first gate structures; second gate structures extending through the first insulating interlayer and the second insulating interlayer on the second region of the substrate, a lower portion of each of the second gate structures having a third width, and an upper portion of each of the second gate structures having a fourth width that is greater than the third width and that gradually increases from a bottom toward a top thereof; and a second spacer structure on a sidewall of each of the second gate structures, an upper end of the second spacer structure having a height that is different from a height of an upper end of the first spacer structure, wherein a first distance between the first gate structures is less than a second distance between the second gate structures.

The embodiments may be realized by providing a semiconductor device including a first insulating interlayer on a substrate; a second insulating interlayer on the first insulating interlayer; a gate structure extending through the first insulating interlayer and the second insulating interlayer on the substrate, a lower portion of the gate structure having a first width, and an upper portion of the gate structure having a second width that is greater than the first width and that gradually increases from a bottom toward a top thereof; and a spacer structure on a sidewall of the gate structure, wherein an upper portion of the spacer structure has an oxygen concentration that is different from an oxygen concentration of a lower portion of the spacer structure.

BRIEF DESCRIPTION OF THE DRAWINGS

Features will be apparent to those of skill in the art by describing in detail exemplary embodiments with reference to the attached drawings in which:

FIGS. 4 to 17 illustrate cross-sectional views of stages in a method of manufacturing a semiconductor device in accordance with example embodiments;

FIGS. 19 to 23 illustrate cross-sectional views of stages in a method of manufacturing a semiconductor device in accordance with example embodiments.

DETAILED DESCRIPTION

Figure 1:
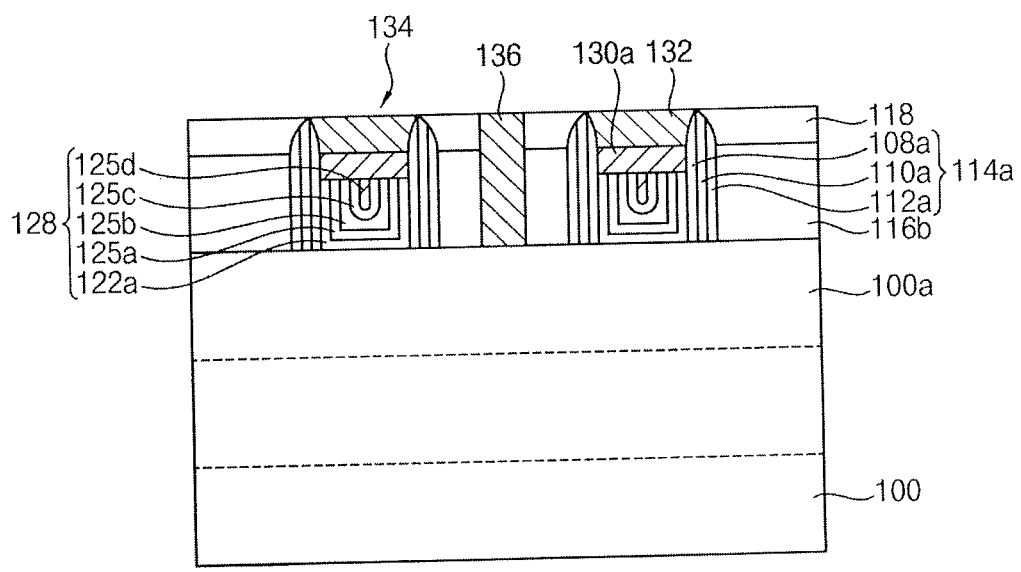
FIG. 1 illustrates a cross-sectional view of a semiconductor device in accordance with example embodiments.
Figure 2:
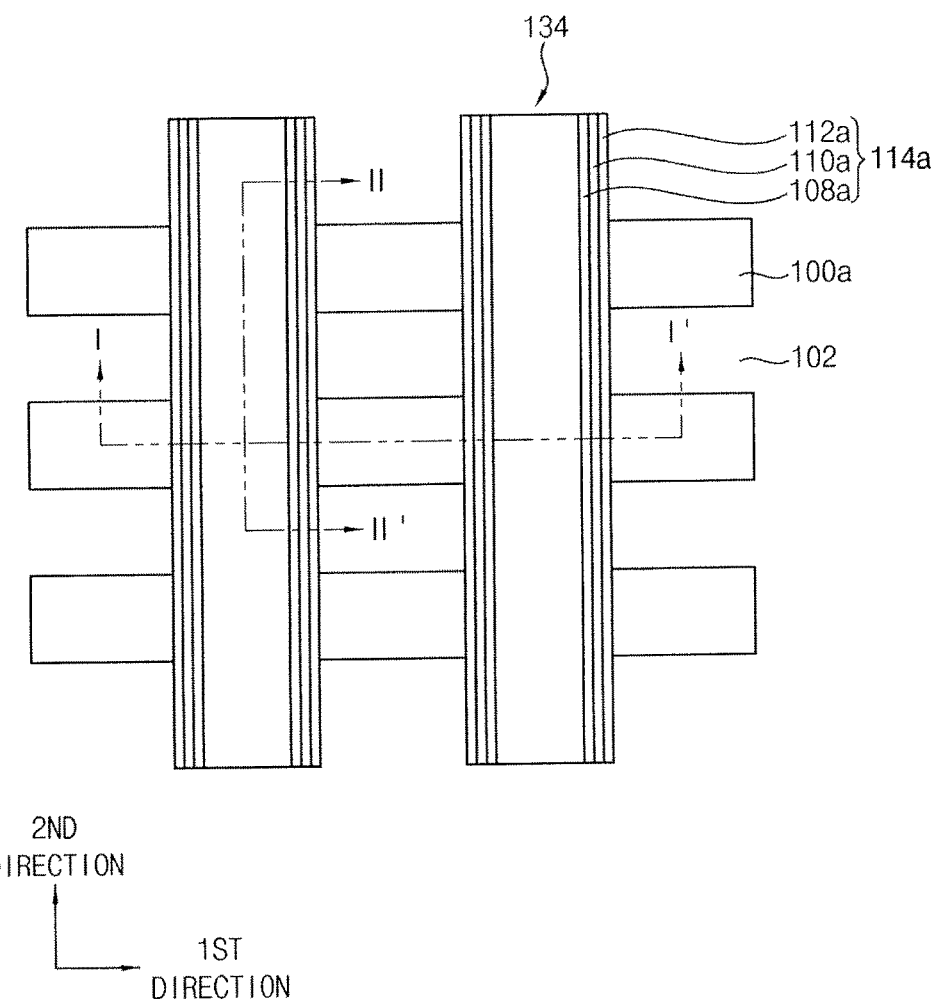
FIG. 2 illustrates a plan view of a semiconductor device in accordance with example embodiments.
Figure 3:
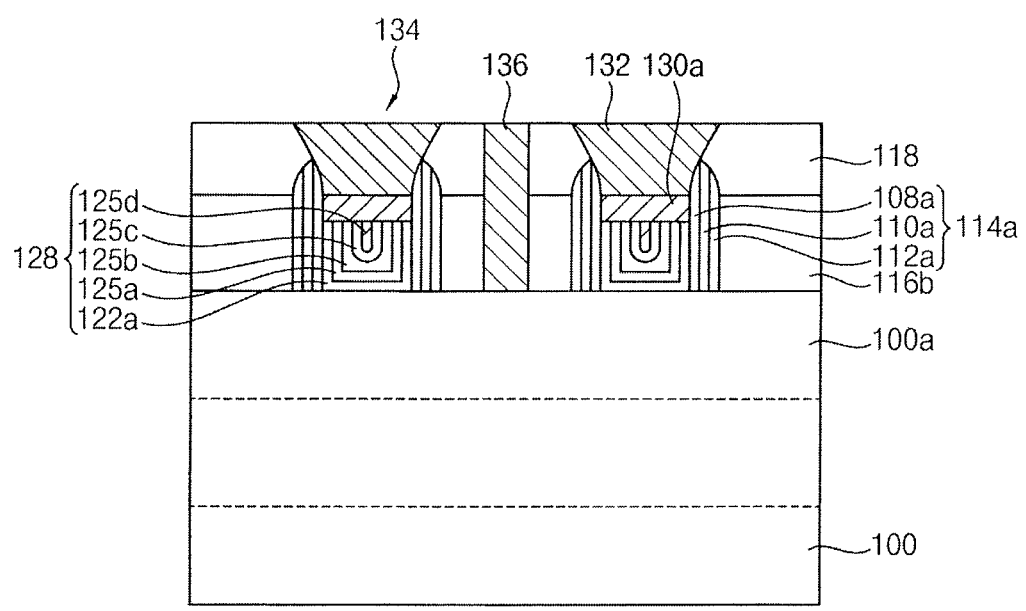
FIG. 3 illustrates a cross-sectional view of a semiconductor device in accordance with other example embodiments.

FIG. 1 illustrates a cross-sectional view of a semiconductor device in accordance with example embodiments. FIG. 2 illustrates a plan view of a semiconductor device in accordance with example embodiments. FIG. 3 illustrates a cross-sectional view of a semiconductor device in accordance with other example embodiments.

Referring to FIGS. 1 and 2, a plurality of active patterns 100*a* may protrude upwardly (e.g., away) from an upper surface of a substrate 100. A gate structure 134 may extend on the active patterns 100*a* in a direction crossing a direction in which the active pattern 100*a* extend. A spacer structure 114*a* may be on sidewalls of the gate structure 134.

The substrate 100 may include a semiconductor material, e.g., silicon, germanium, silicon-germanium, etc., or III-V semiconductor compounds, e.g., GaP, GaAs, GaSb, etc. In an implementation, the substrate 100 may be a silicon-on-insulator (SOI) substrate, or a germanium-on-insulator (GOI) substrate.

Each of the active patterns 100*a* may extend in a first direction substantially parallel to the upper surface of the substrate 100. The active patterns 100*a* may be arranged (e.g., may be repeatedly provided) in a second direction crossing the first direction. In an implementation, the first direction and the second direction may be substantially perpendicular to each other.

An isolation layer 102 may be formed between the active patterns 100*a*. The isolation layer 102 may fill a lower portion of a trench between the active patterns 100*a*. The isolation layer 102 may include an oxide, e.g., silicon oxide. A portion of the active pattern 100*a* not covered by the isolation layer 102 may be referred to as an active region.

In an implementation, no active pattern may be formed. In this case, the isolation layer 102 may fill a trench on the substrate 100, and a planar type transistor may be formed on the substrate 100.

A first insulating interlayer 116*b* may be formed on the active patterns 100*a* and the isolation layer 102. An upper surface of the first insulating interlayer 116*b* (e.g., a surface facing away from or distal to the substrate 100) may be substantially flat. The upper surface of the first insulating interlayer 116b may be higher (e.g., farther from the substrate 100) than upper surfaces of the active patterns 100a. Thus, the first insulating interlayer 116b may cover the active patterns 100a.

The first insulating interlayer 116b may include, e.g., silicon having good gap filling characteristics.

A second insulating interlayer 118 may be formed on the first insulating interlayer 116b. The second insulating interlayer 118 may include, e.g., silicon nitride or silicon oxide. The second insulating interlayer 118 may have an etching tolerance and a strength that is higher than an etching tolerance and a strength of the first insulating interlayer 116b.

A first opening may extend through the first insulating interlayer 116b and the second insulating interlayer 118. A sidewall and the upper surface of the active pattern 100a may be exposed by the first opening.

The gate structure 134 may be formed in the first opening. The gate structure 134 may extend in the second direction to cross the active patterns 100a.

The gate structure 134 may include a lower gate structure 128, an upper gate structure 130a, and a hard mask 132 that are sequentially stacked. The lower gate structure 128 may fill a lower portion of the first opening. The lower gate structure 128 may include a gate insulation layer 122a and a plurality of gate electrode layers, e.g., first to fourth gate electrode layers 125a, 125b, 125c and 125d.

The first to fourth gate electrode layers 125a, 125b, 125c and 125d may be conformally formed on a sidewall and a bottom of the first opening. The gate insulation layer 122a may include a metal oxide, e.g., hafnium oxide (HfO$_2$), tantalum oxide (Ta$_2$O$_5$), zirconium oxide (ZrO$_2$), etc. The first to fourth gate electrode layers 125a, 125b, 125c and 125d may include a metal or a metal nitride. The first to fourth gate electrode layers 125a, 125b, 125c and 125d may be sequentially stacked. In an implementation, the first to fourth gate electrode layers 125a, 125b, 125c and 125d may include at least one electrode layer for controlling a threshold voltage and at least one electrode layer for decreasing resistance.

The first to third gate electrode layers 125a, 125b and 125c may be sequentially stacked on the gate insulation layer 122a. The first to third gate electrode layers 125a, 125b and 125c may be conformally formed on the sidewall and the bottom of the first opening. The fourth gate electrode layer 125d may be formed on the third gate electrode layer 125c, and may fill an inner space formed by the third gate electrode layer 125c.

The first gate electrode layer 125a may include, e.g., titanium, titanium nitride, tantalum, tantalum nitride, etc. The second gate electrode layer 125b may include, e.g., TiAlC, TiAlCN, TiAlSiCN, etc. The third gate electrode layer 125c may include, e.g., titanium, titanium nitride, tantalum, tantalum nitride, etc. The fourth gate electrode layer 125d may include, e.g., aluminum (Al), copper (Cu), etc. In this case, the first, second and third gate electrode layers 125a, 125b and 125c may serve as electrode layers for controlling a threshold voltage, and the fourth gate electrode layer 125d may serve as an electrode layer for decreasing resistance.

The upper gate structure 130a may be formed on the lower gate structure 128. The upper gate structure 130a may decrease the resistance of the gate structure 134. In an implementation, the upper gate structure 130a may include a material that is substantially the same as a material of the fourth gate electrode layer 125d.

The hard mask 132 may be formed on the upper gate structure 130a, and may fill a remaining portion of the first opening.

An upper width of the gate structure 134 may be different from a lower width of the gate structure 134 (e.g., a width of the gate structure 134 at a portion distal to the substrate 100 may be different from a width of the gate structure at a portion proximate to the substrate 100). In an implementation, the upper width of the gate structure 134 may be greater than the lower width of the gate structure 134.

The spacer structure 114a may be formed on a sidewall of the gate structure 134. In an implementation, the spacer structure 114a may include a plurality of spacers, e.g., first to third spacers 108a, 110a and 112a sequentially stacked on the sidewall of the gate structure 134. At least one of the first to third spacers 108a, 110a and 112a may include a low dielectric material having a dielectric constant lower than a dielectric constant of silicon nitride. The low dielectric material may include, e.g., SiOCN, SiOC, etc.

The first spacer 108a may include, e.g., silicon nitride. The second spacer 110a may include, e.g., a low dielectric material. The third spacer 112a may include, e.g., silicon nitride.

In an implementation, the spacer structure 114a may include two spacers sequentially stacked, or more than three spacers sequentially stacked.

In an implementation, the spacer structure 114a may entirely cover the sidewall of the gate structure 134.

In an implementation, as shown in FIG. 3, the spacer structure 114a may not cover an upper portion of the sidewall of the gate structure 134. In this case, an upper surface or end of the spacer structure 114a may be lower (e.g., closer to the substrate 100) than an upper surface of the gate structure 134. In an implementation, the upper surface or end of the spacer structure 114a may be higher than an upper surface of the upper gate structure 130a. Thus, the spacer structure 114a may cover sidewalls of the lower and upper gate structures 128 and 130a.

An oxygen concentration of the spacer structure 114a may change according to portions thereof (e.g., different portions of the spacer structure 114a may have different oxygen concentrations from one another). An oxygen concentration of an upper portion of the spacer structure 114a may be higher than an oxygen concentration of a lower portion of the spacer structure 114a. In an implementation, the oxygen concentration of the spacer structure 114a may gradually decrease from a top toward a bottom thereof. For example, the bottom of the spacer structure 114a may have no or little oxygen therein.

The upper portion of the spacer structure 114a may have a width that is different from a width of the lower portion of the spacer structure 114a. The upper portion of the spacer structure 114a may have a width that is less than a width of the lower portion of the spacer structure 114a. The width of the lower portion of the spacer structure 114a may be constant or uniform, and the width of the upper portion of the spacer structure 114a may gradually decrease from a bottom toward a top thereof. Each of opposite upper sidewalls of the spacer structure 114a may have a slope with respect to an upper surface of the substrate 100, and the slopes of the opposite sidewalls of the spacer structure 114a may have different directions from each other. In a cross-sectional view, a distance from the upper sidewall of the spacer structure 114a to a central portion of the spacer structure 114a may gradually decrease from a bottom toward a top thereof.

Hereinafter, a portion of the spacer structure 114a protruding from (e.g., above or farther away from the substrate 100) an upper surface of the first insulating interlayer 116b may be defined as the upper portion of the spacer structure 114a. An upper width of the upper portion of the spacer structure 114a may be less than a lower width of the upper portion of the spacer structure 114a. The width of the upper portion of the spacer structure 114a may gradually decrease from a bottom toward a top thereof.

A width of the gate structure 134 may change according to the shape of the spacer structure 114a covering the sidewall of the gate structure 134. Thus, the width of the gate structure 134 contacting the upper portion of the spacer structure 114a may be relatively large.

A lower portion of the gate structure 134 may have a first width, and an upper portion of the gate structure 134 may have a second width that is greater than the first width. The first width may be constant, and the second width may be gradually increased from a bottom toward a top of the gate structure 134. Upper sidewalls of the gate structure 134 may have slopes (e.g., may be inclined relative to a surface of the substrate 100).

The gate structure 134 may have an enlarged upper width, and thus may be easily formed.

A contact plug 136 may be formed between the gate structures 134 through the first and the second insulating interlayers 116b and 118, and may contact the upper surface of the active pattern 100a.

The spacer structure 114a may have a reduced upper width, and thus a distance between the contact plug 136 and the upper portion of the spacer structure 114a may increase. Thus, a parasitic capacitance between the contact plug 136 and the gate structure 134 due to the spacer structure 114a may decrease, and the effective resistance of the contact plug 136 may be decreased.

FIGS. 4 to 17 illustrate cross-sectional views of stages in a method of manufacturing a semiconductor device in accordance with example embodiments.

In FIG. 4, a left figure is a cross-sectional view taken along the second direction, and a right figure is a cross-sectional view taken along the first direction. FIGS. 5 to 17 are cross-sectional views taken along the first direction.

Referring to FIG. 4, an upper portion of a substrate 100 may be partially etched to form a trench 101. As the trench 101 is formed on the substrate 100, a plurality of active patterns 100a may be formed on the substrate 100. Each of the active patterns 100a may extend in the first direction. An isolation layer 102 may be formed to fill a lower portion of the trench 101. In this case, a fin-type transistor may be formed by subsequent processes.

The substrate 100 may include a single crystalline semiconductor material, and thus the active patterns 100a, which may be formed from the substrate 100, may have single crystallinity.

In an implementation, the isolation layer 102 may be formed by forming an insulation layer on the substrate 100 to sufficiently fill the trench 101, planarizing the insulation layer until an upper surface of the substrate 100 may be exposed, and removing an upper portion of the insulation layer to expose upper sidewalls of the active patterns 100a. The insulation layer may include an oxide, e.g., silicon oxide.

In an implementation, the isolation layer 102 may be formed to have a multi-layered structure. For example, the isolation layer 102 may be formed by conformally forming an insulation liner on an inner wall of the trench 101, and forming an insulation pattern on the insulation liner to partially fill the trench 101. The insulation liner may include, e.g., silicon oxide, silicon nitride, etc.

In an implementation, the active pattern may be omitted on the substrate 100. For example, an upper portion of the substrate 100 may be anisotropically etched to form a trench 101, and the isolation layer 102 may be formed to sufficiently fill the trench 101. In this case, a planar type transistor may be formed by subsequent processes.

Figure 5:
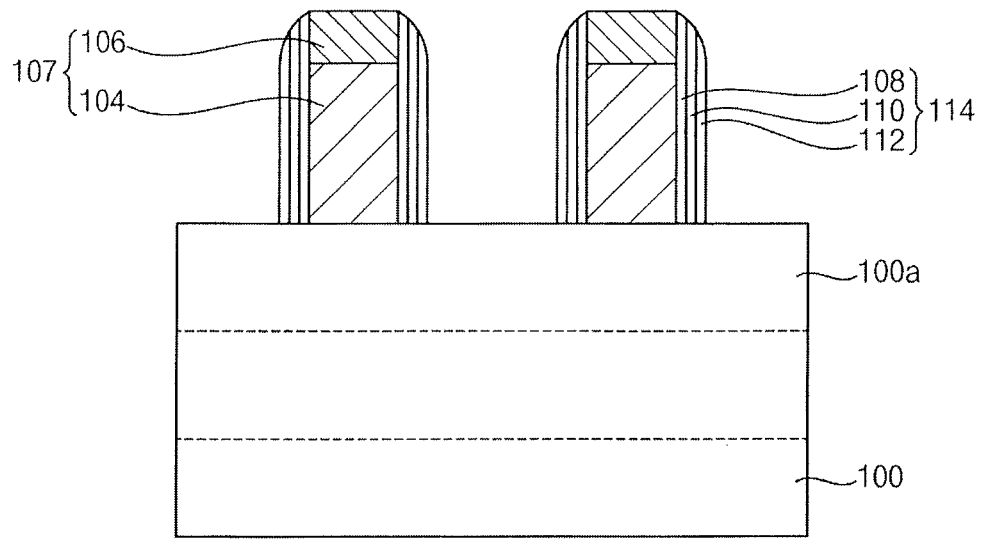

Referring to FIG. 5, a dummy gate structure 107 may be formed on the active patterns 100a and the isolation layer 102. The dummy gate structure 107 may include a dummy gate insulation pattern, a dummy gate electrode 104, and a hard mask 106 that are sequentially stacked. A preliminary spacer structure 114 including a plurality of preliminary spacers, e.g., first to third preliminary spacers 108, 110 and 112, may be formed on a sidewall of the dummy gate structure 107.

In an implementation, a dummy gate insulation layer may be conformally formed on the active patterns 100a and the isolation layer 102. The dummy gate insulation layer may include, e.g., silicon oxide. In an implementation, the dummy gate insulation layer may be formed by a thermal oxidation process, or a deposition process, e.g., a chemical vapor deposition (CVD) process or an atomic layer deposition (ALD) process. A dummy gate electrode layer may be formed on the dummy gate insulation layer. The dummy gate electrode layer may be formed to sufficiently fill the trenches 101. A top surface of the dummy gate electrode layer may be higher (e.g., farther from the substrate 100) than a top surface of each of the active patterns 100a. The dummy gate electrode layer may include, e.g., polysilicon. The dummy gate electrode layer may be formed by a CVD process or an ALD process. The hard mask 106 may be formed on the dummy gate electrode layer, and the dummy gate electrode layer and the dummy gate insulation layer may be patterned using the hard mask 106 as an etching mask to form the dummy gate structure 107 including the dummy gate insulation pattern, the dummy gate electrode 104, and the hard mask 106 that are sequentially stacked.

The dummy gate structure 107 may extend to cross the active patterns 100a. In an implementation, the dummy gate structure 107 may extend in the second direction. A plurality of dummy gate structures 107 may be spaced apart from each other in the first direction.

At least one of the first to third preliminary spacers 108, 110 and 112 included in the preliminary spacer structure 114 may include a low dielectric material having a dielectric constant lower than that of silicon nitride. The low dielectric material may include, e.g., SiOCN, SiOC, etc.

An upper surface of the preliminary spacer structure 114 may have a slope. For example, the upper surface of the preliminary spacer structure 114 may be rounded. An upper width of the preliminary spacer structure 114 may be less than a lower width of the preliminary spacer structure 114. An upper surface or end of a portion of the preliminary spacer structure 114 directly contacting the sidewall of the dummy gate structure 107 may be highest (e.g., farthest from the substrate 100) in the preliminary spacer structure 114, and a height of an upper surface of the preliminary spacer structure 114 may be gradually decreased as a distance from the portion of the preliminary spacer structure 114 directly contacting the sidewall of the dummy gate structure 107 increases.

For example, a first spacer layer may be conformally formed on the dummy gate structure 107, the active pattern 100a, and the isolation layer 102 (refer to FIG. 4). The first spacer layer may be anisotropically etched to form the first preliminary spacer 108. After forming the first preliminary spacer 108, impurities may be implanted into the active pattern 100a to form source/drain regions. A second spacer layer may be conformally formed on the first preliminary spacer 108, the dummy gate structure 107, the active pattern 100a, and the isolation layer 102. The second spacer layer may be anisotropically etched to form the second preliminary spacer 110. A third spacer layer may be conformally formed on the second preliminary spacer 110, the dummy gate structure 107, the active pattern 100a, and the isolation layer 102. The third spacer layer may be anisotropically etched to form the third preliminary spacer 112. Thus, the preliminary spacer structure 114 including the first, second, and third preliminary spacers 108, 110 and 112 may be formed.

In an implementation, a first spacer layer, a second spacer layer, and a third spacer layer may be sequentially formed, and the first spacer layer, the second spacer layer and the third spacer layer may be anisotropically etched to form the preliminary spacer structure 114 including the first, second and third preliminary spacers 108, 110 and 112.

The first preliminary spacer 108 may include, e.g., silicon nitride. The second preliminary spacer 110 may include a low dielectric material. The third preliminary spacer 112 may include, e.g., silicon nitride.

In an implementation, the preliminary spacer structure 114 may include two preliminary spacers, or more than three preliminary spacers sequentially stacked.

Figure 6:
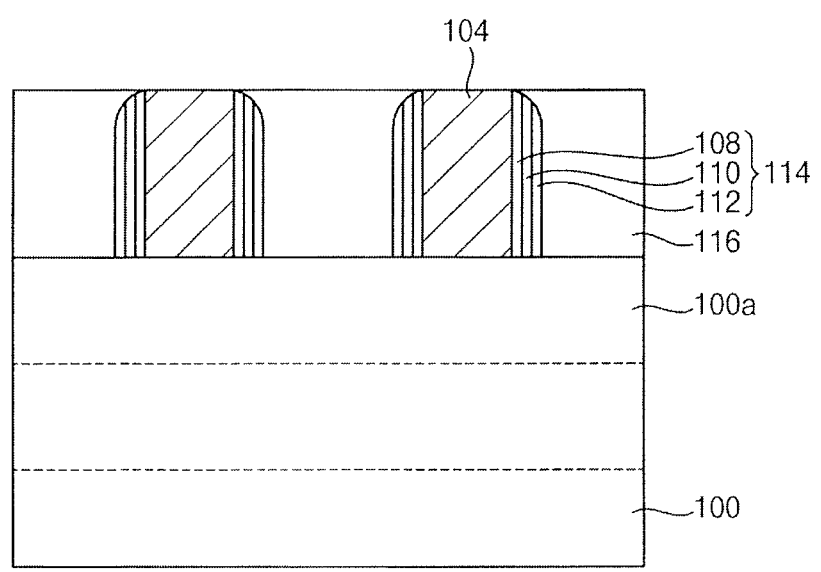

Referring to FIG. 6, a first preliminary insulating interlayer 116 may be formed to fill a gap between the dummy gate structures 107. The first preliminary insulating interlayer 116 may be planarized until an upper surface of the dummy gate electrode 104 is exposed. For example, the hard mask 106 may be removed by the planarization process.

The first preliminary insulating interlayer 116 may include, e.g., silicon oxide. The planarization process may include a chemical mechanical polishing (CMP) process and/or an etch back process. The first preliminary insulating interlayer 116 may be formed between the dummy gate structures 107 to have no void therein. Thus, the first preliminary insulating interlayer 116 may include silicon oxide having good gap filling characteristics. The first preliminary insulating interlayer 116 may be formed by a CVD process, an ALD process or a spin on glass (SOG) process, etc.

Figure 7:
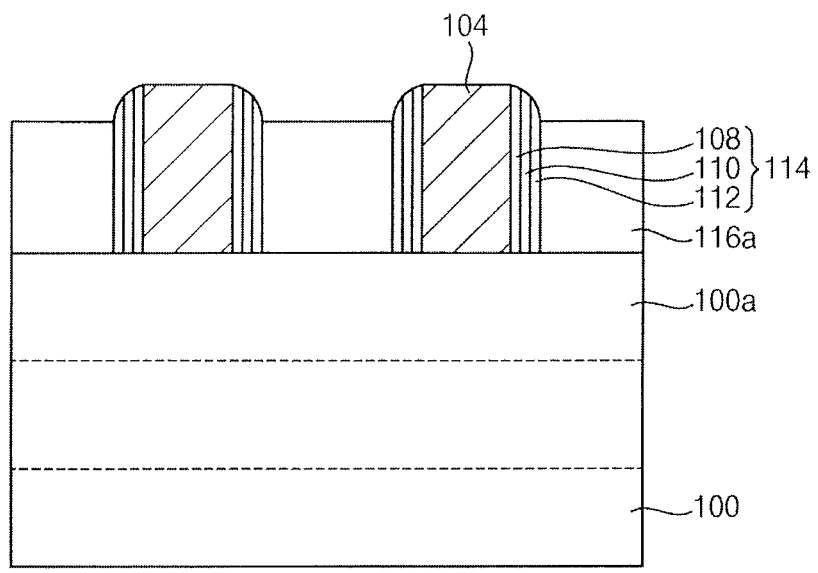

Referring to FIG. 7, an upper portion of the first preliminary insulating interlayer 116 may be partially removed to form a second preliminary insulating interlayer 116a. An upper portion of the preliminary spacer structure 114 may be exposed by partially removing the first preliminary insulating interlayer 116. As a height of an upper surface of the second preliminary insulating interlayer 116a decreases, an exposed portion of the preliminary spacer structure 114 may increase.

According to the height of the exposed portion of the preliminary spacer structure 114 in a third direction substantially perpendicular to the upper surface of the substrate 100, a width and a height of an upper portion of a gate structure subsequently formed may be controlled. When the height of the exposed portion of the preliminary spacer structure 114 increases, the width and the height of the upper portion of the gate structure may increase.

Figure 8:
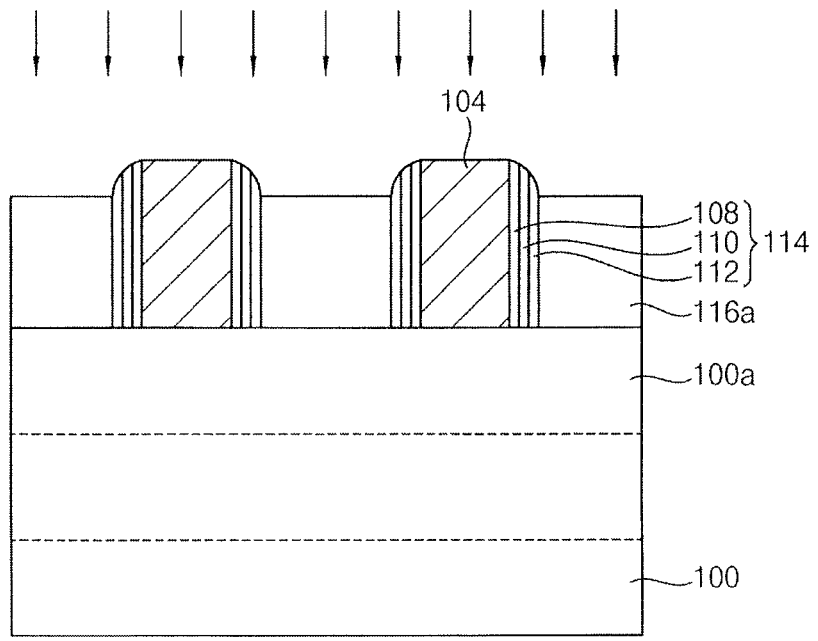

Referring to FIG. 8, an oxygen plasma treatment may be performed on the second preliminary insulating interlayer 116a, the dummy gate electrode 104, and the preliminary spacer structure 114.

Oxygen may be supplied onto the exposed portion of the preliminary spacer structure 114 by the oxygen plasma treatment, so that a surface of the preliminary spacer structure 114 may be oxidized. An oxygen concentration of the exposed portion of the preliminary spacer structure 114 may be greater than that of a non-exposed portion of the preliminary spacer structure 114. Thus, an oxygen concentration of an upper portion of the preliminary spacer structure 114 may be greater than that of a lower portion of the preliminary spacer structure 114. For example, an oxygen concentration of the preliminary spacer structure 114 may decrease from the exposed surface toward the lower portion thereof in the third direction.

When the oxygen plasma treatment is performed, a surface of the dummy gate electrode 104 may be rarely oxidized (e.g., may not be oxidized or only mildly oxidized).

Figure 9:
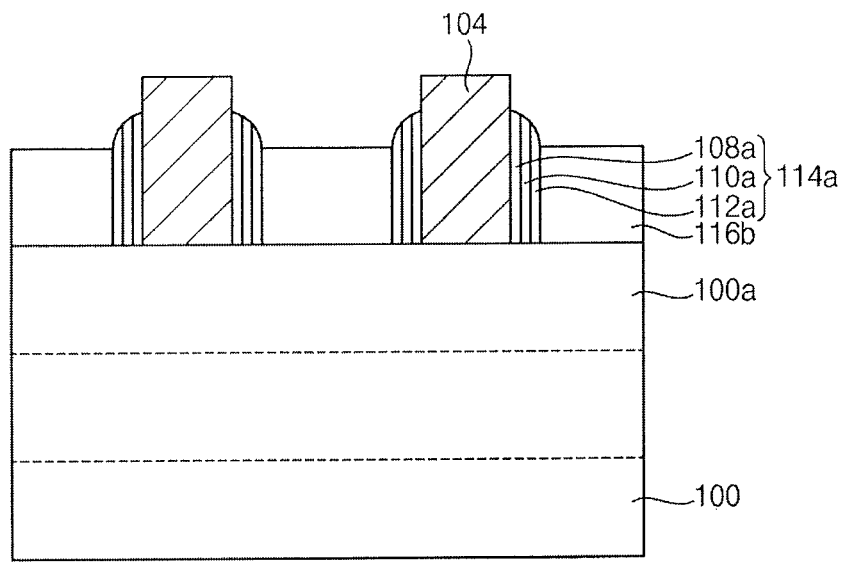

Referring to FIG. 9, an upper portion of the second preliminary insulating interlayer 116a may be removed to form a first insulating interlayer 116b.

During an etching process of the second preliminary insulating interlayer 116a, the oxidized portion of the preliminary spacer structure 114 may have an etch rate that is greater than that of other portions of the preliminary spacer structure 114. For example, when the second preliminary insulating interlayer 116a is etched, the oxidized portion of the preliminary spacer structure 114 may be also etched. As the preliminary spacer structure 114 is partially etched, a spacer structure 114a may be formed on the sidewall of the dummy gate electrode 104. An upper portion of the dummy gate electrode 104 may not be covered by the spacer structure 114a but exposed.

According to the height of the upper surface of the second preliminary insulating interlayer 116a, a thickness of the exposed portion of the preliminary spacer structure 114 may be changed, and thus the oxidized portion of the preliminary spacer structure 114 by the oxygen plasma treatment may be also changed. As the oxidized portion of the preliminary spacer structure 114 increases, the etched portion of the preliminary spacer structure 114 may increase. Accordingly, the height of the spacer structure 114a may be controlled by controlling the height of the upper surface of the second preliminary insulating interlayer 116a.

The spacer structure 114a may protrude from or above an upper surface of the first insulating interlayer 116b. A portion of the spacer structure 114a protruding from the upper surface of the first insulating interlayer 116b may be rounded. An upper width of the protruding portion of the spacer structure 114a may be less than a lower width thereof. A height of an upper surface or end of a portion of the spacer structure 114a directly contacting the dummy gate electrode 104 may be greatest in the protruding portion of the spacer structure 114a, and a height of an upper surface of the spacer structure 114a may decrease as a distance from the portion directly contacting the dummy gate electrode 104 increases.

Figure 10:
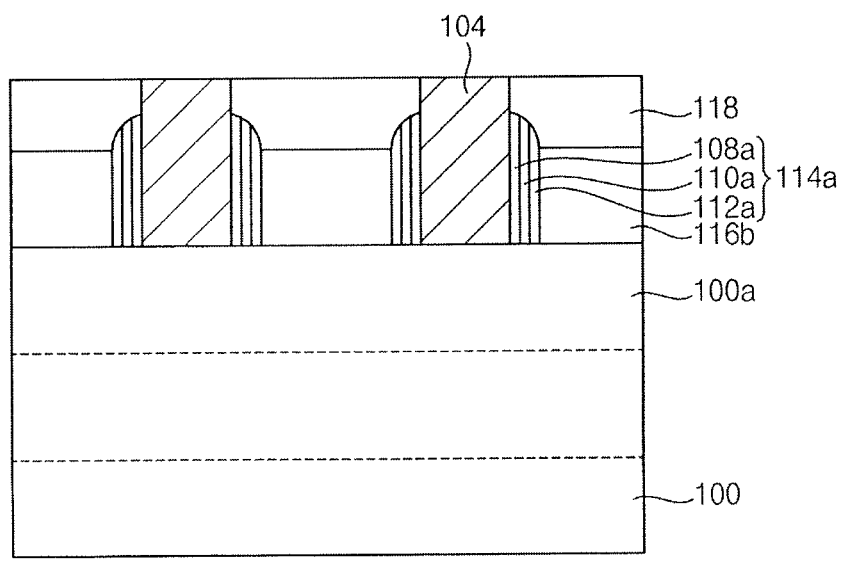

Referring to FIG. 10, a second insulating interlayer 118 may be formed on the first insulating interlayer 116b, the spacer structure 114a, and the dummy gate electrode 104.

For example, the second insulating interlayer 118 may be formed to fill spaces between the dummy gate electrodes 104. The second insulating interlayer 118 may be planarized until an upper surface of the dummy gate electrode 104 is exposed. The planarization process may include a chemical mechanical polishing (CMP) process and/or an etch back process.

The second insulating interlayer 118 may include, e.g., silicon nitride or silicon oxide. The second insulating interlayer 118 may have an etching tolerance and a strength greater than those of the first insulating interlayer 116b.

The second insulating interlayer 118 may be formed by a CVD process or an ALD process.

Figure 11:
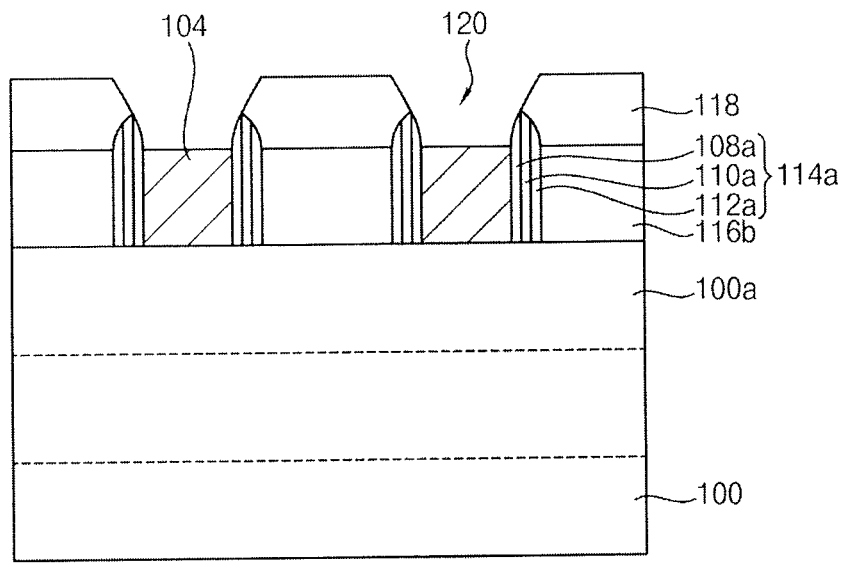

Referring to FIG. 11, an upper portion of the dummy gate electrode 104 may be removed by a first etching process to form a first preliminary opening 120.

In an implementation, the first etching process may include a dry etching process. The dummy gate electrode 104 may have a first etch rate in the first etching process.

During the first etching process for forming the first preliminary opening 120, a portion of the second insulating interlayer 118 adjacent the dummy gate electrode 104 may also be etched. In the first preliminary opening 120, a second portion thereof higher (e.g., farther from the substrate 100) than the upper surface or end of the spacer structure 114a may have a width that is greater than that of a first portion lower (e.g., closer to the substrate 100) than the upper surface of the spacer structure 114a. The width of the second portion of the first preliminary opening 120 may gradually increase from a bottom toward a top of the second portion of the first preliminary opening 120. A sidewall of the second portion of the first preliminary opening 120 may have a slope.

Figure 12:
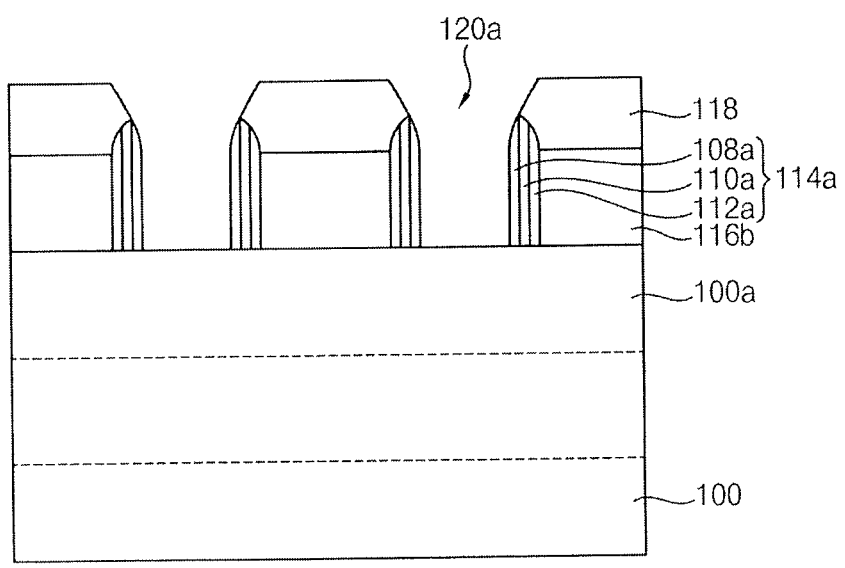

Referring to FIG. 12, a remaining portion of the dummy gate electrode 104 under or at a bottom of the first preliminary opening 120 may be removed by a second etching process to form a first opening 120a.

In an implementation, the second etching process may include a wet etching process. The dummy gate electrode 104 may have a second etch rate in the second etching process, which may be less than the first etch rate in the first etching process.

An upper surface and an upper sidewall of the active pattern 100a and an upper surface of the isolation layer 102 may be exposed by the first opening 120a. The first opening 120a may extend in the second direction.

In the first opening 120a, a second portion higher than the upper surface of the first insulating interlayer 116b may have a width that is greater than that of a first portion lower than the upper surface of the first insulating interlayer 116b. The width of the second portion of the first opening 120a may gradually increase from a bottom toward a top of the second portion of the first opening 120a. A sidewall of the second portion of the first opening 120a may have a slope.

During the second etching process for forming the first opening 120a, an upper portion of a first sidewall of the spacer structure 114a exposed by the first preliminary opening 120 may be also etched. For example, when the first opening 120a is formed, the upper portion of the spacer structure 114a may have a reduced width. As the first opening 120a is formed, the first sidewall of the spacer structure 114a may not be supported by the dummy gate electrode 104, which may reduce the stress on the first sidewall of the spacer structure 114a.

An upper portion of the spacer structure 114a may have a width that is less than that of a lower portion thereof. The width of the upper portion of the spacer structure 114a may gradually decrease from a bottom toward a top thereof. Each of opposite upper sidewalls of the spacer structure 114a may have a slope with respect to the upper surface of the substrate 100. The directions of the opposite sidewalls of the spacer structure 114a may be different (e.g., may slope away) from each other.

Figure 13:
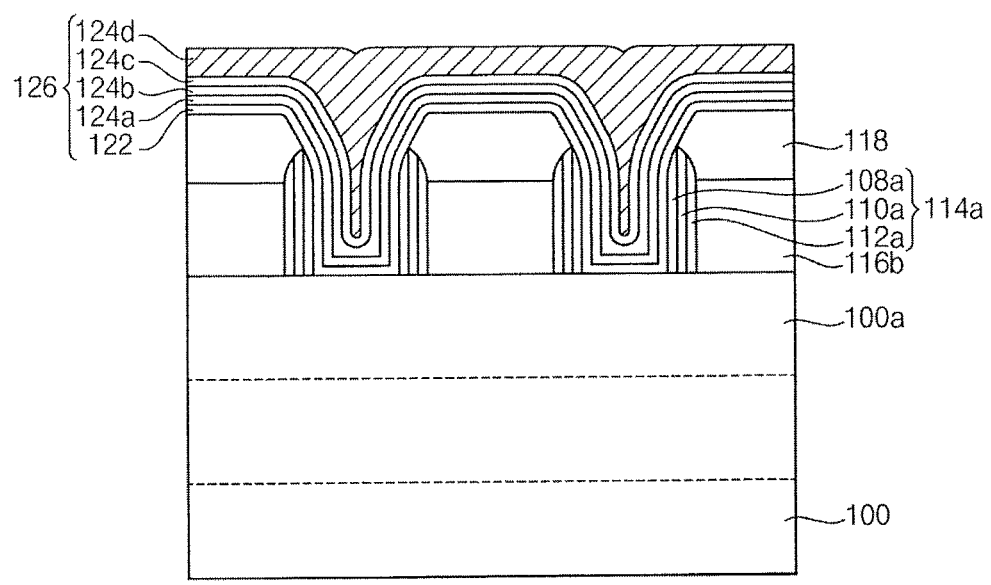

Referring to FIG. 13, a gate structure layer 126 may be formed on the exposed upper surfaces of the active pattern 100a and the isolation layer 102 and an upper surface of the second insulating interlayer 118 to fill the first opening 120a.

For example, a first insulation layer may be conformally formed on the exposed upper surfaces of the active pattern 100a and the isolation layer 102 and the upper surface of the second insulating interlayer 118. The first insulation layer may include, e.g., silicon oxide. The first insulation layer may be formed by, e.g., an ALD process, a CVD process, or a thermal oxidation process. A preliminary gate insulation layer 122 may be conformally formed on the first insulation layer. A plurality of preliminary gate electrode layers, e.g., first to fourth preliminary gate electrode layers 124a, 124b, 124c and 124d may be sequentially formed on the preliminary gate insulation layer 122 to fill the first opening 120a.

The preliminary gate insulation layer 122 may include a metal oxide. For example, the preliminary gate insulation layer 122 may include hafnium oxide, tantalum oxide, zirconium oxide, etc. The preliminary gate insulation layer 122 may be formed by, e.g., a CVD process or an ALD process.

The first to fourth preliminary gate electrode layers 124a, 124b, 124c and 124d may include a metal or a metal nitride. The first to fourth preliminary gate electrode layers 124a, 124b, 124c and 124d may be stacked on the preliminary gate insulation layer 122. For example, the first to fourth preliminary gate electrode layers 124a, 124b, 124c and 124d may include at least one electrode layer for controlling a threshold voltage and at least one electrode layer for reducing resistance.

In an implementation, the first preliminary gate electrode layer 124a may include, e.g., titanium, titanium nitride, tantalum, tantalum nitride, etc. The second gate electrode layer 124b may include, e.g., titanium aluminum carbide (TiAlC), titanium aluminum carbonitride (TiAlCN), titanium aluminum silicon carbonitride (TiAlSiCN), etc. The third preliminary gate electrode layer 124c may include, e.g., titanium, titanium nitride, tantalum, tantalum nitride, etc. The fourth preliminary gate electrode layer 124d may include aluminum, copper, etc. The first to third preliminary gate electrode layers 124a, 124b and 124c may serve as an electrode layer for controlling a threshold voltage, and the fourth preliminary gate electrode layer 124d may serve as an electrode layer for reducing resistance.

When the preliminary gate insulation layer 122 and the first to fourth preliminary gate electrode layers 124a, 124b, 124c and 124d are formed, an inner width of the first opening 120a may be reduced. Thus, the fourth preliminary gate electrode layer 124d may not be formed in the first opening 120a.

In an implementation, the second portion of the first opening 120a may have the width that is greater than that of the first portion thereof, and the preliminary gate insulation layer 122 and the first to fourth preliminary gate electrode layers 124a, 124b, 124c and 124d may be easily formed in the first opening 120a. Accordingly, the fourth preliminary gate electrode layer 124d may be formed in the first opening 120a with no seam or void therein.

In an implementation, an additional process for filling the fourth preliminary gate electrode layer 124d into the first opening 120a may be omitted. For example, a chamfering process in which upper portions of the first to third preliminary gate electrode layers 124a, 124b and 124c in the first opening 120a are partially removed before forming the fourth preliminary gate electrode layer 124d to enlarge a space for the fourth preliminary gate electrode layer 124d may be omitted.

Figure 14:
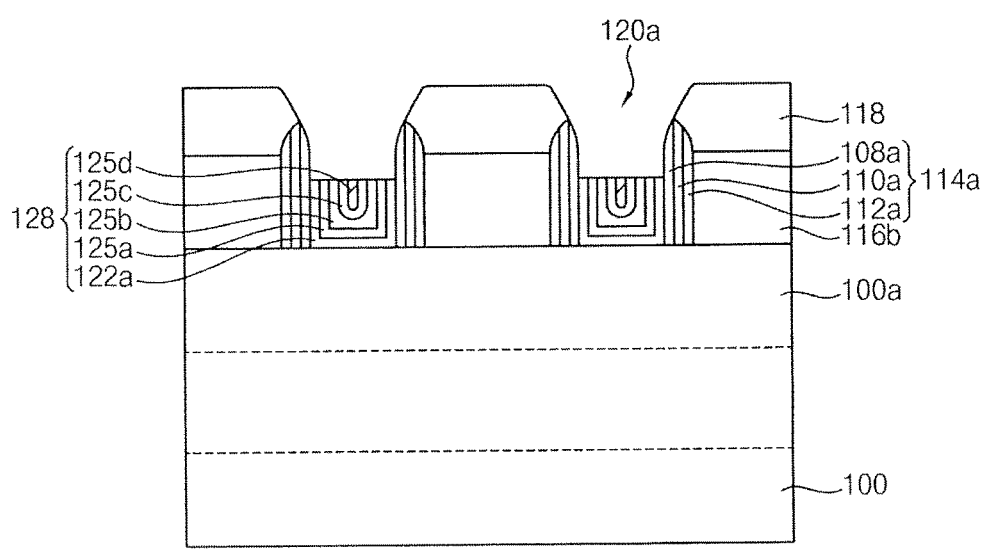

Referring to FIG. 14, a portion of the preliminary gate structure layer 126 on the second insulating interlayer 118 may be removed, and a portion of the preliminary gate structure layer 126 in the first opening 120a may be partially removed to form a lower gate structure 128 in a lower portion of the first opening 120a. The lower gate structure 128 may include first to fourth gate electrode layers 125a, 125b, 125c and 125d.

In an implementation, an upper surface of the lower gate structure 128 may be substantially coplanar with or lower than the upper surface of the first insulating interlayer 116b.

Figure 15:
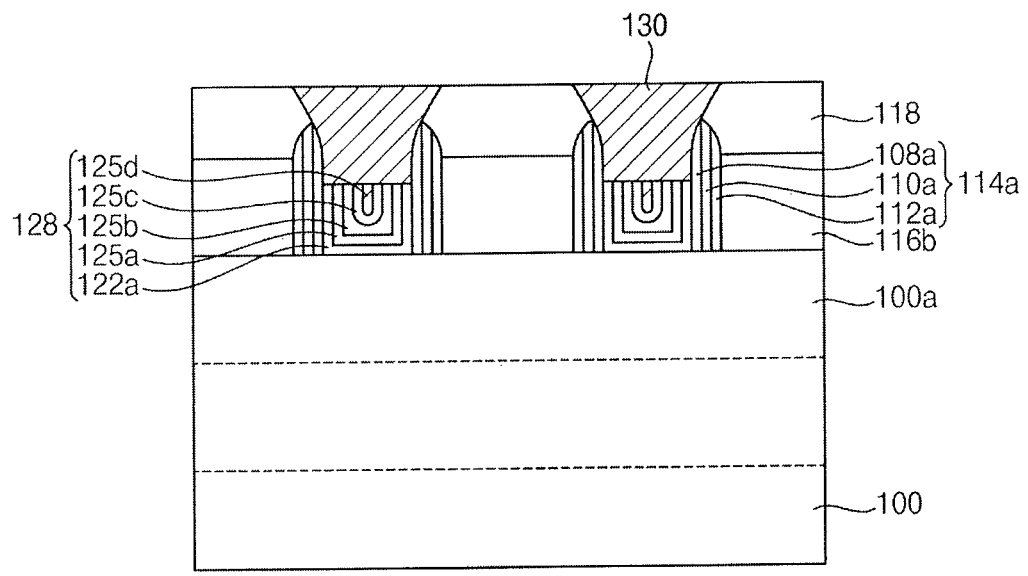

Referring to FIG. 15, a conductive layer may be formed on the lower gate structure 128 and the second insulating interlayer 118 to fill the first opening 120a. The conductive layer may include a metal or a metal nitride.

Figure 16:
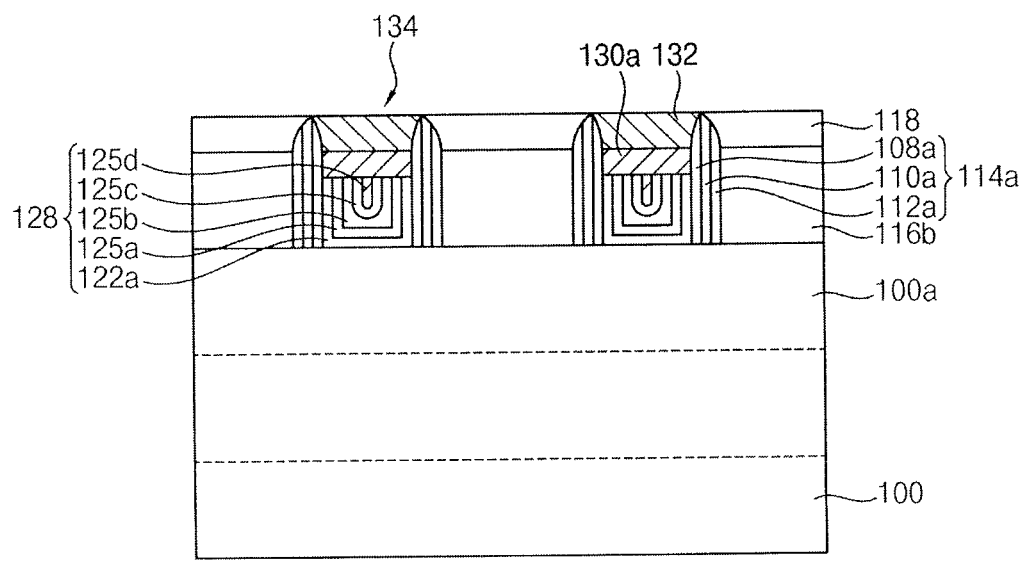

The conductive layer may help reduce the total resistance of a gate structure 134 (refer to FIG. 16). Thus, the conductive layer may include a material substantially the same as that of the fourth gate electrode layer 125d.

The conductive layer may be planarized until the upper surface of the second insulating interlayer 118 is exposed to form a preliminary upper gate structure 130 on the lower gate structure 128.

Referring to FIG. 16, an upper portion of the preliminary upper gate structure 130 may be removed to form a trench, and the preliminary upper gate structure 130 may be transformed into an upper gate structure 130a. A hard mask layer may be formed on the upper gate structure 130a and the second insulating interlayer 118 to fill the trench.

The hard mask layer may be planarized until the upper surface of the second insulating interlayer 118 is exposed to form a hard mask 132 on the upper gate structure 130a. The hard mask 132 may include, e.g., silicon nitride or silicon oxynitride.

The lower gate structure 128, the upper gate structure 130a, and the hard mask 132 sequentially stacked may form the gate structure 134.

During the planarization process, an upper portion of the second insulating interlayer 118 may be partially removed so as to expose an upper surface of the spacer structure 114a. For example, the spacer structure 114a may cover a sidewall of the gate structure 134. An upper surface of the gate structure 134 may be substantially coplanar with an upper surface of the spacer structure 114a (e.g., the upper surface of the gate structure 134 may be the same distance from the substrate 100 as the upper end of the spacer structure 114a).

In an implementation, as shown in FIG. 3, the upper surface of the spacer structure 114a may not be exposed during the planarization process of the hard mask layer. For example, the upper surface of the spacer structure 114a may be covered by the second insulating interlayer 118. In this case, the spacer structure 114a may cover a lower sidewall of the gate structure 134. Thus, the upper surface of the gate structure 134 may be higher than that of the spacer structure 114a.

An oxygen concentration of the spacer structure 114a may be changed or may vary according to portions thereof or positions therein. An oxygen concentration of an upper portion of the spacer structure 114a may be higher than that of a lower portion thereof. A width of the spacer structure 114a may be changed or may vary according to portions or relative positions thereof. A width of the upper portion of the spacer structure 114a may be less than that of the lower portion thereof.

A width of an upper portion of the gate structure 134 may be greater than that of a lower portion thereof. The lower portion of the gate structure 134 may have a first width, and the upper portion of the gate structure 134 may have a second width that is greater than the first width.

Figure 17:
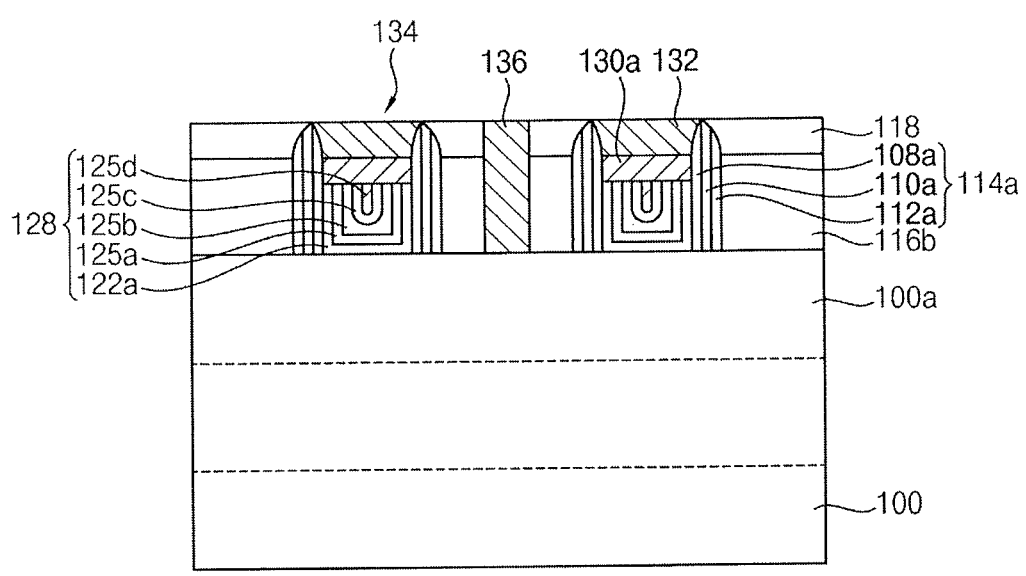

Referring to FIG. 17, a contact plug 136 may be formed between the gate structures 134 to contact an upper surface of the active pattern 100a.

The width of the upper portion of the spacer structure 114a may decrease from a bottom toward a top thereof, and thus a distance between the contact plug 136 and the upper portion of the spacer structure 114a may increase according to a height thereof. Thus, the parasitic capacitance between the contact plug 136 and the gate structure 134 may be advantageously reduced.

Figure 18:
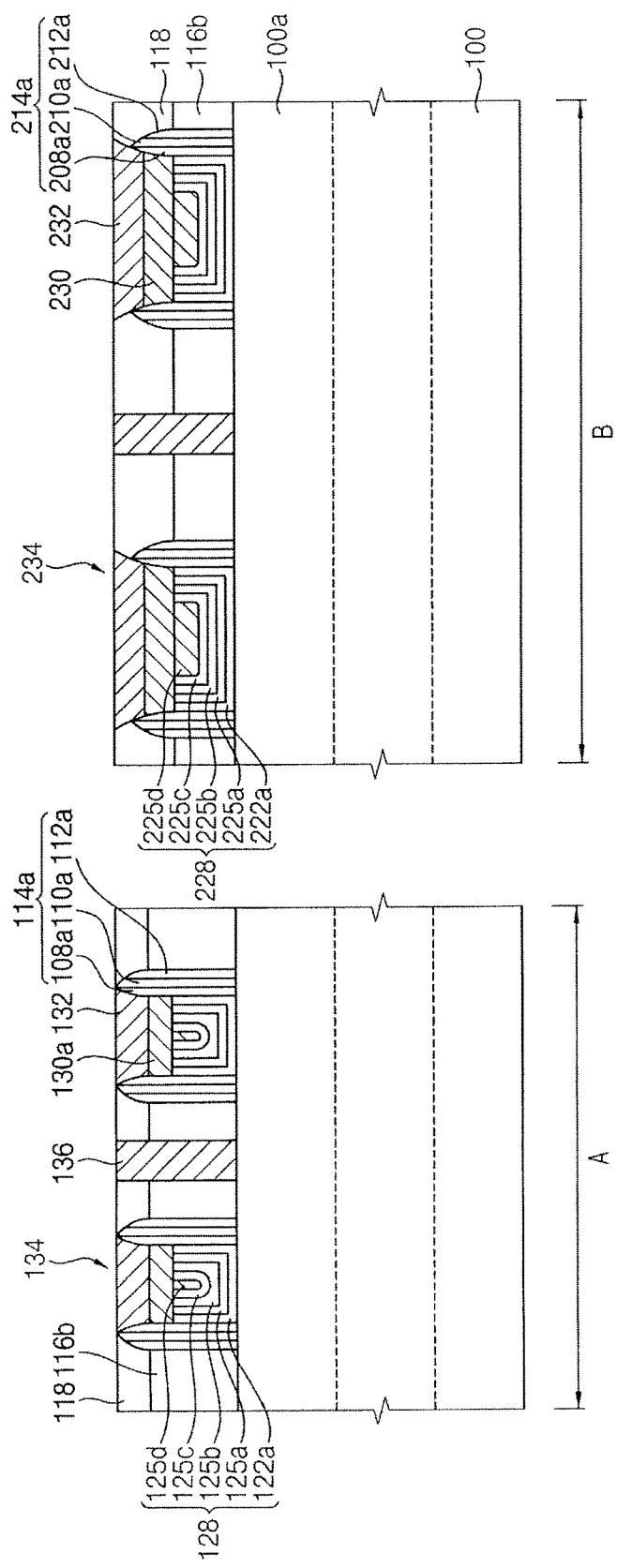
FIG. 18 illustrates a cross-sectional view of a semiconductor device in accordance with example embodiments.

FIG. 18 illustrates a cross-sectional view of a semiconductor device in accordance with example embodiments. This semiconductor device may include transistors having different shapes from each other.

Referring to FIG. 18, first transistors may be formed on a first region A of the substrate 100, and second transistors may be formed on a second region B of the substrate 100.

The active patterns 100a may be formed on the first and second regions A and B of the substrate 100.

The first transistor may include the gate structure 134 and the spacer structure 114a, which may be referred to as a first gate structure 134 and a first spacer structure 114a, respectively, hereinafter. The second transistor may include a second gate structure 234 and a second spacer structure 214a.

In an implementation, the first transistor may be substantially the same as that illustrated with reference to FIGS. 1 and 2.

A distance between the (e.g., adjacent) first gate structures 134 may be different from a distance between the (e.g., adjacent) second gate structures 234. In an implementation, the distance between the first gate structures 134 may be less than the distance between the second gate structures 234.

In an implementation, a width of each of the first gate structure 134 may be different from a width of each of the second gate structure 234. In an implementation, the width of each of the first gate structure 134 may be substantially the same as the width of each of the second gate structure 234.

The first spacer structure 114a may at least partially cover a sidewall of the first gate structure 134, and the second spacer structure 214a may least partially cover a sidewall of the second gate structure 234. A height of an upper surface or end of the first spacer structure 114a may be different from a height of an upper surface or end of the second spacer structure 214a.

The first insulating interlayer 116b may be formed on the first and second regions A and B of the substrate 100. The first insulating interlayer 116b may include, e.g., silicon oxide. An upper surface of the first insulating interlayer 116b may have different heights on the first and second regions A and B, respectively, of the substrate 100. In an implementation, an upper surface of a portion of the first insulating interlayer 116b on the first region A of the substrate 100 may have a first height, and an upper surface of a portion of the first insulating interlayer 116b on the second region B of the substrate 100 may have a second height that is lower (e.g., closer to the substrate 100) than the first height.

The second insulating interlayer 118 may be formed on the first insulating interlayer 116b. The second insulating interlayer 118 may include, e.g., silicon nitride or silicon oxide. The second insulating interlayer 118 may have an etching tolerance and a strength that is greater than those of the first insulating interlayer 116b.

In an implementation, an upper surface of the second insulating interlayer 118 may be flat on the first and second regions A and B of the substrate 100. Thus, a portion of the second insulating interlayer 118 on the first region A of the substrate 100 may have a first thickness, and a portion of the second insulating interlayer 118 on the second region B of the substrate 100 may have a second thickness that is greater than the first thickness.

A first opening may extend through the first and second insulating interlayers 116b and 118 on the first region A of the substrate 100, and a second opening may extend through the first and second insulating interlayers 116b and 118 on the second region B of the substrate 100. A sidewall and an upper surface of the active pattern 100a may be exposed by the first and second openings.

The first gate structure 134 may be formed in the first opening, and the second gate structure 234 may be formed in the second opening.

The first gate structure 134 may include the lower gate structure 128, the upper gate structure 130a, and the hard mask 132 that are sequentially stacked, which may be referred to as a first lower gate structure 128, a first upper gate structure 130a, and a first hard mask 132, respectively, hereinafter. An upper width of the first gate structure 134 may be different from a lower width of the first gate structure 134. In an implementation, the upper width of the first gate structure 134 may be greater than the lower width of the first gate structure 134.

The first spacer structure 114a may include a plurality of spacers, e.g., the first to third spacers 108a, 110a, and 112a sequentially stacked on the sidewall of the first gate structure 134. At least one of the first to third spacers 108a, 110a and 112a may include a low dielectric material having a dielectric constant lower than a dielectric constant of silicon nitride.

A lower portion of the first gate structure 134 may have a first width, and an upper portion of the first gate structure 134 may have a second width that is greater than the first width. The second width may be gradually increased from a bottom toward a top of the gate structure 134.

The second gate structure 234 may include a second lower gate structure 238, a second upper gate structure 230, and a second hard mask 232 that are sequentially stacked. An upper width of the second gate structure 234 may be different from a lower width of the second gate structure 234. A lower portion of the second gate structure 234 may have a third width, and an upper portion of the second gate structure 234 may have a fourth width that is greater than the third width. In an implementation, the third width may be greater than the first width.

The second spacer structure 214a may include a plurality of spacers, e.g., fourth to sixth spacers 208a, 210a, and 212a that are sequentially stacked on the sidewall of the second gate structure 234. In an implementation, the second spacer structure 214a may have substantially the same stacked structure as that of the first spacer structure 114a. In an implementation, the second spacer structure 214a may have a stacked structure that is different from that of the first spacer structure 114a.

A width of an upper portion of the second spacer structure 214a may be less than a width of a lower portion of the second spacer structure 214a. Each of opposite upper sidewalls of the second spacer structure 214a may have a slope. The slopes of the opposite upper sidewalls may have different directions.

A height (e.g., distance from the substrate 100) of an upper surface or end of the second spacer structure 214a may be less than that of a height of the upper surface or end of the first spacer structure 114a.

In an implementation, the upper surface of the second spacer structure 214a may be substantially coplanar with or lower than the upper surface of the second gate structure 234. For example, the upper end of the second spacer structure 214a may be the same distance from or closer to the substrate 100 than a distance from the substrate 100 to the upper surface of the second gate structure 234

In an implementation, an oxygen concentration of each of the first and second spacer structures 114a and 214a may change or vary according to portions thereof or positions therein. For example, an oxygen concentration of an upper portion of the first spacer structure 114a may be higher than an oxygen concentration of a lower portion of the first spacer structure 114a. An oxygen concentration of an upper portion of the second spacer structure 214a may be higher than an oxygen concentration of a lower portion of the second spacer structure 214a.

In an implementation, the first region A of the substrate 100 may serve as a low voltage transistor region, and the second region B of the substrate 100 may serve as a middle voltage transistor region or a high voltage transistor region.

FIGS. 19 to 23 illustrate cross-sectional views of stages in a method of manufacturing a semiconductor device in accordance with example embodiments.

Figure 19:
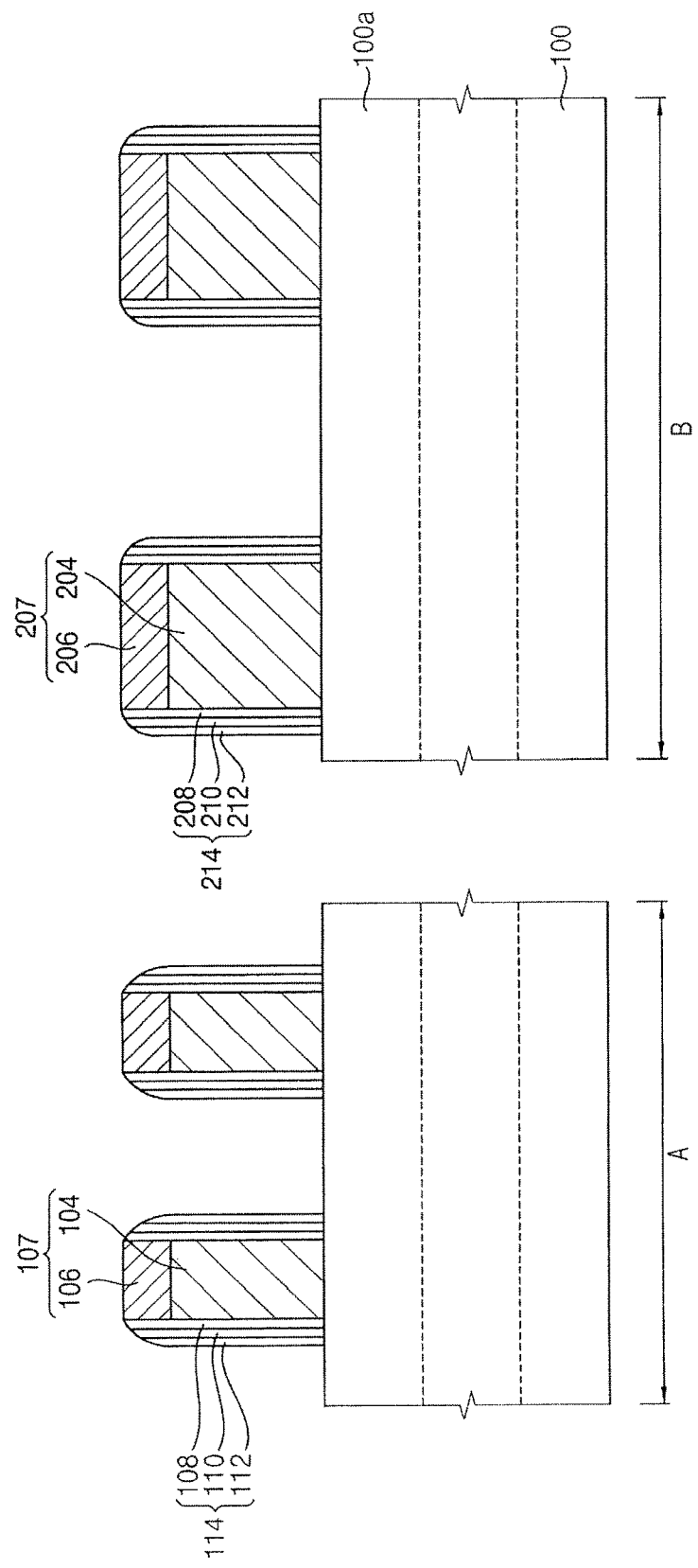

Referring to FIG. 19, processes substantially the same as or similar to those illustrated with reference to FIGS. 4 and 5 may be performed on the substrate 100 including the first and second regions A and B.

Thus, the dummy gate structure 107 and the preliminary spacer structure 114, which may be referred to as a first dummy gate structure 107 and a first preliminary spacer structure 114, respectively, hereinafter, may be formed on the first region A of the substrate 100, and a second dummy gate structure 207 and a second preliminary spacer structure 214 may be formed on the second region B of the substrate 100. The first dummy gate structure 107 may include the dummy gate insulation pattern, the dummy gate electrode 104, and the hard mask 106 that are sequentially stacked, which may be referred to as a first dummy gate insulation layer, a first dummy gate electrode 104 and a first hard mask 106, respectively, hereinafter. The second dummy gate structure 207 may include a second dummy gate insulation layer, a second dummy gate electrode 204, and a second hard mask 206 that are sequentially stacked.

In an implementation, the second dummy gate structure 207 may have a width greater than that of the first dummy gate structure 107. A distance between the second dummy gate structures 207 may be greater than a distance between the first dummy gate structures 107.

Figure 20:
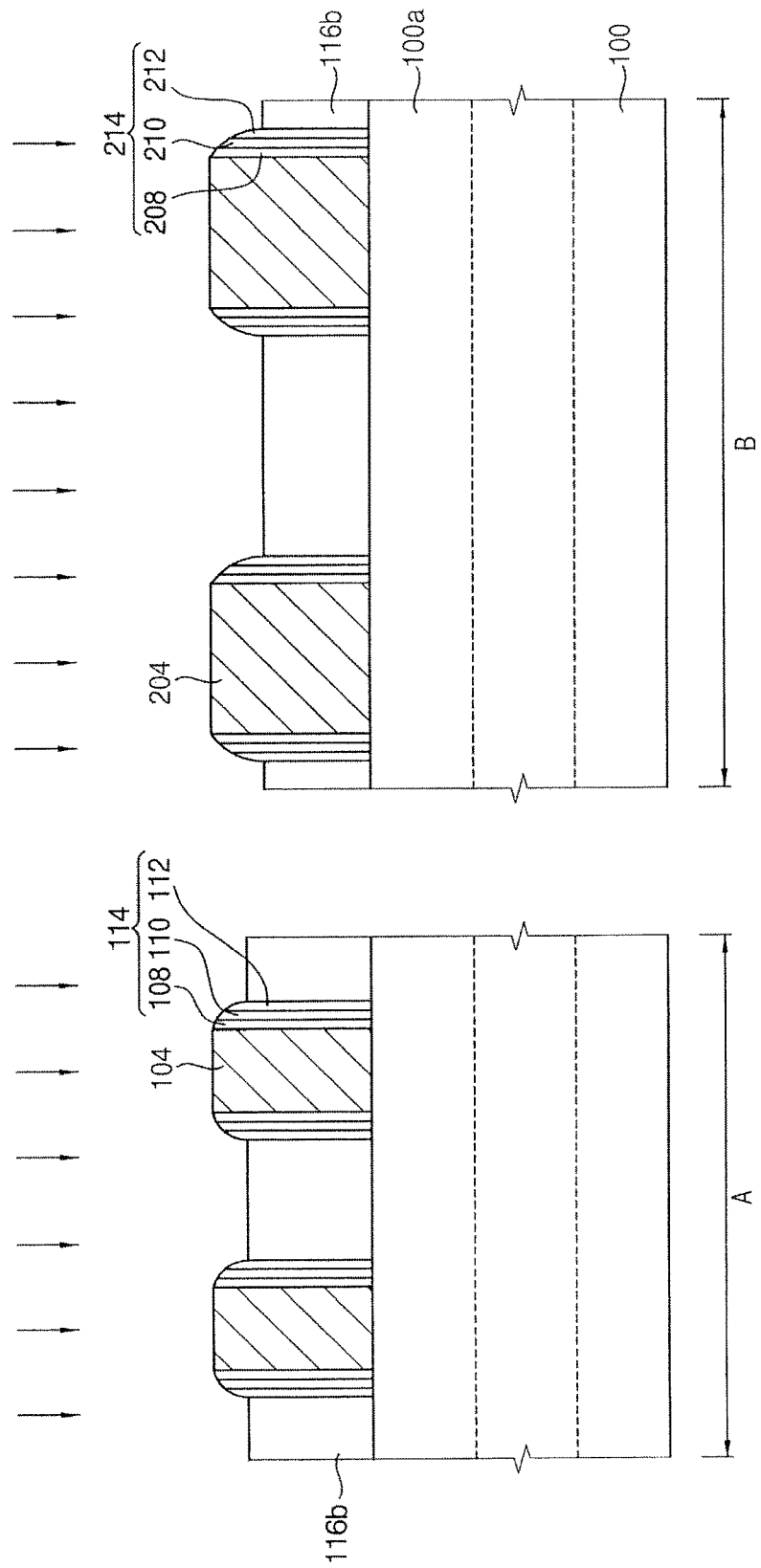

Referring to FIG. 20, processes substantially the same as or similar to those illustrated with reference to FIGS. 6 to 8 may be performed.

Thus, the first preliminary insulating interlayer 116 may be formed to fill a gap between the first dummy gate structures 107 and between the second dummy gate structures 207. An upper portion of the first preliminary insulating interlayer 116 may be partially removed to form the second preliminary insulating interlayer 116a, and the first and second hard masks 106 and 206 may be removed.

The distance between the first dummy gate electrodes 104 may be less than the distance between the second dummy gate electrodes 204, and thus thicknesses of portions of the first preliminary insulating interlayer 116 on the respective first and second regions A and B that are removed may not be the same. In an implementation, a thickness of the removed portion of the first preliminary insulating interlayer 116 on the second region B of the substrate 100 may be greater than a thickness of the removed portion of the first preliminary insulating interlayer 116 on the first region A of the substrate 100.

Accordingly, an upper surface of a portion of the second preliminary insulating interlayer 116a on the first region A of the substrate 100 may have a height greater than a height of an upper surface of a portion of the second preliminary insulating interlayer 116a on the second region B of the substrate 100.

As the height of the second insulating interlayer 116a decreases, sizes of exposed upper portions of the first and second preliminary spacer structures 114 and 214 may increase. Thus, the size of the exposed upper portion of the second preliminary spacer structure 214 may be greater than that of the exposed upper portion of the first preliminary spacer structure 114.

An oxygen plasma treatment may be performed on the second preliminary insulating interlayer 116a, the first and second dummy gate electrodes 104 and 204, and the first and second preliminary spacer structures 114 and 214. The size of the exposed upper portion of the second preliminary spacer structure 214 may be greater than that of the exposed upper portion of the first preliminary spacer structure 114, and thus a size of an oxidized portion of the second preliminary spacer structure 214 may be greater than a size of an oxidized portion of the first preliminary spacer structure 114.

Figure 21:
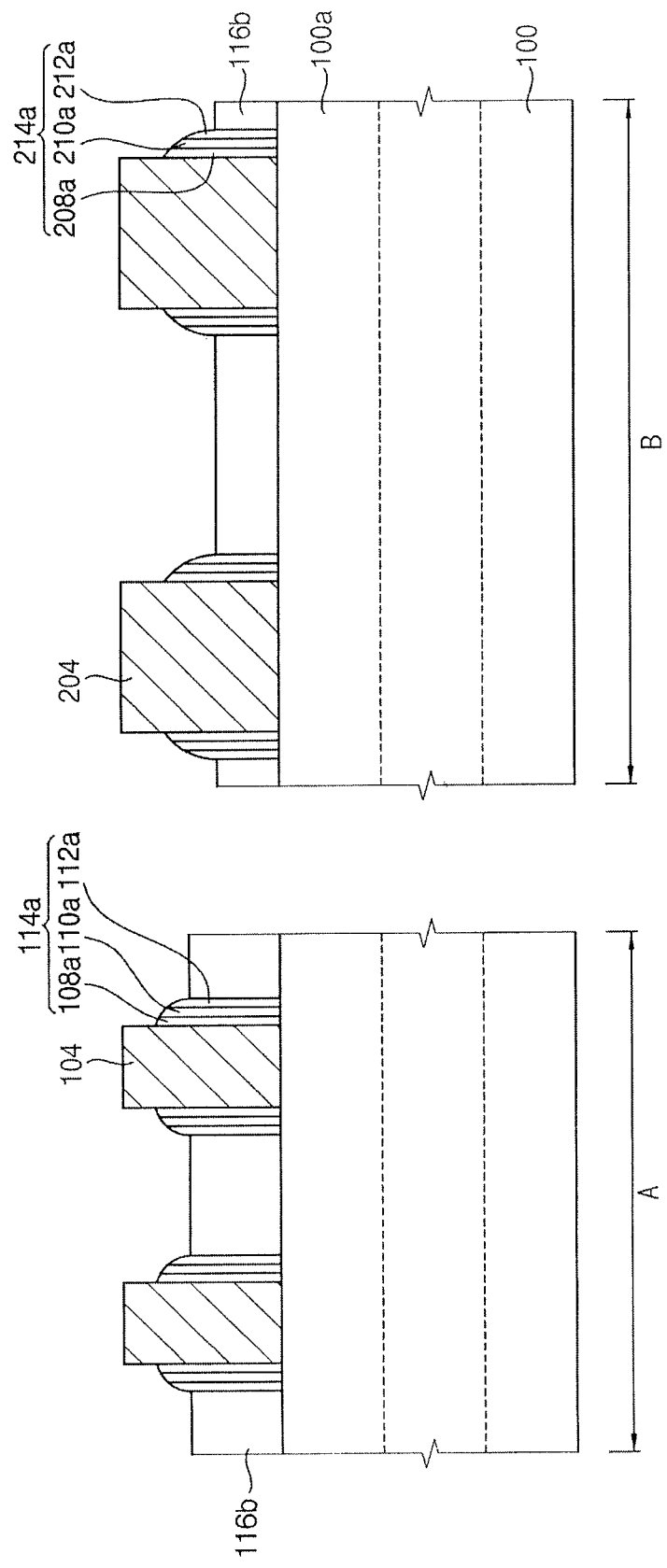

Referring to FIG. 21, an upper portion of the second preliminary insulating interlayer 116a may be removed to form the first insulating interlayer 116b, which may be performed processes substantially the same as or similar to those illustrated with reference to FIG. 9.

During the etching process of the second preliminary insulating interlayer 116a, the oxidized portions of the first and second preliminary spacer structures 114 and 214 may also be etched. Thus, the second preliminary spacer structure 214 may be removed more or to a greater degree than the first preliminary spacer structure 114. By the etching process, the spacer structure 114a, which may be referred to as a first spacer structure 114a hereinafter, and a second spacer structure 214a may be formed.

An upper surface of the first insulating interlayer 116b on the first region A of the substrate 100 may be higher (e.g., farther from the substrate 100) than an upper surface of the first insulating interlayer 116b on the second region B of the substrate 100.

Figure 22:
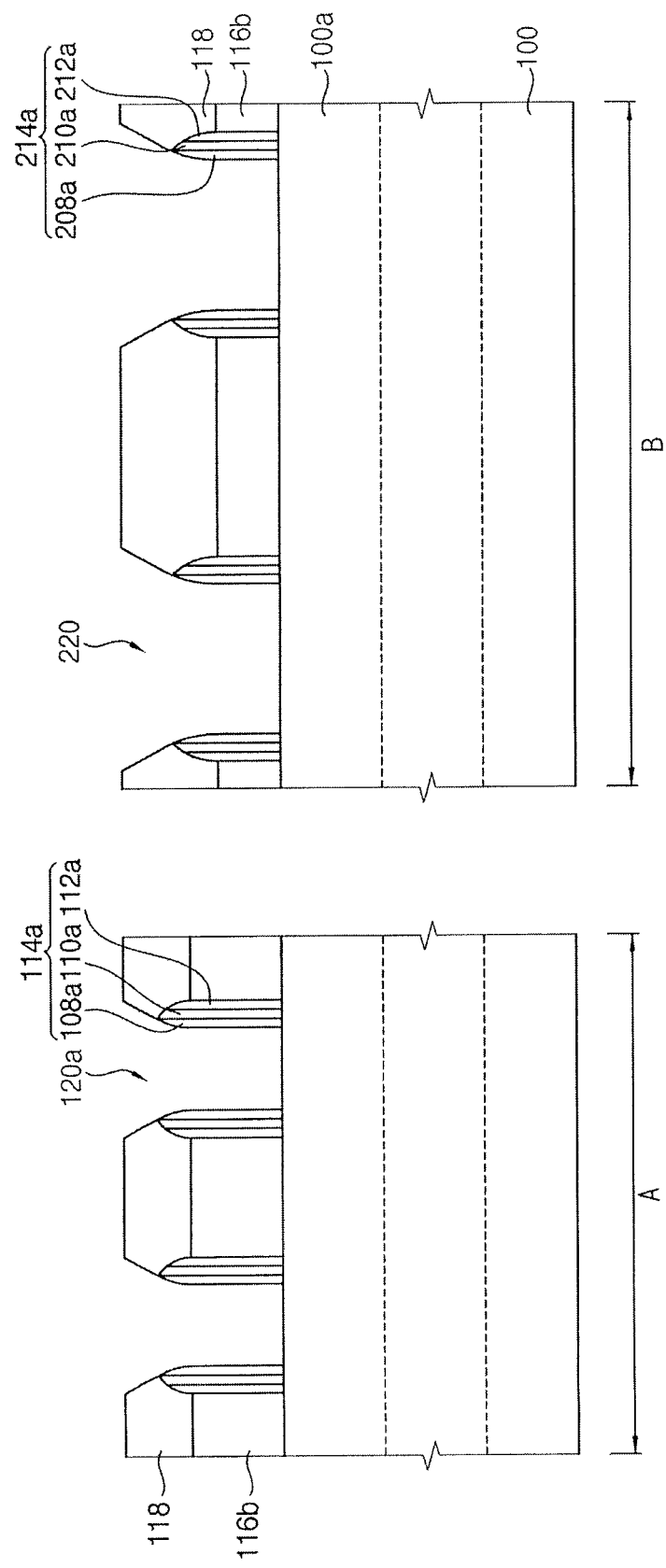

Referring to FIG. 22, processes substantially the same as or similar to those illustrated with reference to FIGS. 10 to 12 may be performed.

For example, the second insulating interlayer 118 may be formed on the first insulating interlayer 116b, the first and second spacer structures 114a and 214a, and the first and second dummy gate electrodes 104 and 204, and planarized. Upper portions of the first and second dummy gate electrodes 104 and 204 may be removed by a first etching process to form the first preliminary opening 120 and a second preliminary opening. Remaining portions of the first and second dummy gate electrodes 104 and 204 under the first preliminary opening 120 and the second preliminary opening, respectively, may be removed by a second etching process to form the first opening 120a and a second opening 220, respectively.

The first opening 120a may be formed by removing the first dummy gate electrode 104, and the second opening 220 may be formed by removing the second dummy gate electrode 204.

In an implementation, in the first opening 120a, a second portion that is higher than an upper surface of the first insulating interlayer 116b may have a width greater than that of a first portion that is lower (e.g., closer to the substrate 100) than the upper surface of first insulating interlayer 116b. The width of the second portion of the first opening 120a may gradually increase from a bottom toward a top of the second portion of the first opening 120a.

In the second opening 220, a fourth portion that is higher than the upper surface of the first insulating interlayer 116b may have a width that is greater than that of a third portion that is lower than the upper surface of first insulating interlayer 116b. The width of the fourth portion of the second opening 220 may gradually increase from a bottom toward a top of the second portion of the second opening 220.

A height of the second portion of the first opening 120a may be lower than a height of the fourth portion of the second opening 220.

During the second etching process for forming the first and second openings 120a and 220, upper portions of the first and second spacer structures 114a and 214a may have a reduced or reducing width. Each of opposite upper sidewalls of each of the first and second spacer structures 114a and 214a may have a slope with respect to the upper surface of the substrate 100. The directions of the opposite sidewalls of each of the first and second spacer structures 114a and 214a may be different from each other.

Referring to FIG. 23, processes substantially the same as or similar to those illustrated with reference to FIGS. 13 to 17 may be performed.

For example, first transistors may be formed on the first region A of the substrate 100, and second transistors may be formed on the second region B of the substrate 100. The first and second transistors may be substantially the same as those of FIG. 18.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

As described above, gate structures having different shapes on the different regions may be formed according to the sizes of the dummy gate structures and distances therebetween.

The semiconductor device in accordance with example embodiments may include various types of transistors including gate structures. For example, the transistor may include nanowire transistors, nanosheet transistors, vertical channel transistors, multi-bridge channel transistors, etc.

The embodiments may provide a semiconductor device including a transistor and a method of manufacturing the same.

The embodiments may provide a semiconductor device including a metal gate structure.

As described above, the transistor may be highly integrated, and may have good characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first insulating interlayer on a substrate;
a second insulating interlayer on the first insulating interlayer;
a gate structure extending through the first insulating interlayer and the second insulating interlayer on the substrate, a lower portion of the gate structure having a constant first width, and an upper portion of the gate structure having a second width that is greater than the first width and that gradually increases from a bottom toward a top thereof; and
a spacer structure on a sidewall of the gate structure, a width of an upper portion of the spacer structure being less than a width of a lower portion of the spacer structure.

2. The semiconductor device as claimed in claim 1, wherein the width of the upper portion of the spacer structure gradually decreases from a bottom toward a top thereof.

3. The semiconductor device as claimed in claim 1, wherein:
each of opposite sidewalls of the spacer structure has a slope with respect to an upper surface of the substrate, and
directions of the slopes of the opposite sidewalls of the spacer structure are different from each other.

4. The semiconductor device as claimed in claim 1, wherein a distance from an upper sidewall of the spacer structure to a central portion of the spacer structure decreases from a bottom toward a top thereof.

5. The semiconductor device as claimed in claim 1, wherein:
the spacer structure includes a plurality of spacers that are sequentially stacked, and
at least one of the plurality of spacers includes a low dielectric material having a dielectric constant lower than a dielectric constant of silicon nitride.

6. The semiconductor device as claimed in claim 1, wherein the upper portion of the spacer structure and the lower portion of the spacer structure have oxygen concentrations that are different from each other.

7. The semiconductor device as claimed in claim 6, wherein the oxygen concentration of the upper portion of the spacer structure is greater than the oxygen concentration of the lower portion of the spacer structure.

8. The semiconductor device as claimed in claim 1, wherein the upper portion of the gate structure has a slope with respect to an upper surface of the substrate.

9. The semiconductor device as claimed in claim 1, wherein:
the gate structure is in an opening extending through the first insulating interlayer and the second insulating interlayer, and
the gate structure includes a plurality of gate electrode layers that are sequentially stacked.

10. The semiconductor device as claimed in claim 9, wherein:
the gate structure includes a lower gate structure, an upper gate structure, and a hard mask, and
the lower gate structure includes a gate insulation layer on an inner wall of the opening and the plurality of gate electrode layers that are sequentially stacked on the gate insulation layer.

11. The semiconductor device as claimed in claim 10, wherein the upper gate structure:
covers the lower gate structure, and
includes a metal.

12. A semiconductor device, comprising:
a first insulating interlayer on a substrate, the substrate including first and second regions;
a second insulating interlayer on the first insulating interlayer;
first gate structures extending through the first insulating interlayer and the second insulating interlayer on the first region of the substrate, a lower portion of each of the first gate structures having a first width, and an upper portion of each of the first gate structures having a second width that is greater than the first width and that gradually increases from a bottom toward a top thereof;
a first spacer structure on a sidewall of each of the first gate structures;
second gate structures extending through the first insulating interlayer and the second insulating interlayer on the second region of the substrate, a lower portion of each of the second gate structures having a third width, and an upper portion of each of the second gate structures having a fourth width that is greater than the third width and that gradually increases from a bottom toward a top thereof; and
a second spacer structure on a sidewall of each of the second gate structures, an upper end of the second spacer structure having a height that is different from a height of an upper end of the first spacer structure,
wherein a first distance between the first gate structures is less than a second distance between the second gate structures.

13. The semiconductor device as claimed in claim 12, wherein:
an upper surface of a portion of the first insulating interlayer on the first region of the substrate is higher than an upper surface of a portion of the first insulating interlayer on the second region of the substrate, and wherein an upper surface of a portion of the second insulating interlayer on the first region of the substrate is coplanar with an upper surface of a portion of the second insulating interlayer on the second region of the substrate.

14. The semiconductor device as claimed in claim 12, wherein the height of the upper end of the first spacer structure is higher than the height of the upper end of the second spacer structure.

15. The semiconductor device as claimed in claim 12, wherein:
a width of an upper portion of the first spacer structure is less than a width of a lower portion of the first spacer structure, and
a width of an upper portion of the second spacer structure is less than a width of a lower portion of the second spacer structure.

16. The semiconductor device as claimed in claim 12, wherein a height of the upper portion of each of the first gate structures is greater than a height of the upper portion of each of the second gate structures.

17. The semiconductor device as claimed in claim 12, wherein:
an upper portion of the first spacer structure has an oxygen concentration that is greater than an oxygen concentration of a lower portion of the first spacer structure, and
an upper portion of the second spacer structure has an oxygen concentration that is greater than an oxygen concentration of a lower portion of the second spacer structure.

18. A semiconductor device, comprising:
a first insulating interlayer on a substrate;
a second insulating interlayer on the first insulating interlayer;
a gate structure extending through the first insulating interlayer and the second insulating interlayer on the substrate, a lower portion of the gate structure having a first width, and an upper portion of the gate structure having a second width that is greater than the first width and that gradually increases from a bottom toward a top thereof; and
a spacer structure on a sidewall of the gate structure,
wherein an upper portion of the spacer structure has an oxygen concentration that is different from an oxygen concentration of a lower portion of the spacer structure.

19. The semiconductor device as claimed in claim 18, wherein a width of the upper portion of the spacer structure is less than a width of the lower portion of the spacer structure.

20. The semiconductor device as claimed in claim 18, wherein a sidewall of the upper portion of the gate structure has a slope with respect to an upper surface of the substrate.

* * * * *